US012795853B2

(12) United States Patent
Chi et al.

(10) Patent No.: US 12,795,853 B2
(45) Date of Patent: Nov. 10, 2026

(54) WATER-COOLING HEAT DISSIPATION DEVICE WITH ADJUSTABLE FAN DIRECTION

(71) Applicant: SILVERSTONE TECHNOLOGY CO., LTD., New Taipei City (TW)

(72) Inventors: Yen-Shu Chi, New Taipei City (TW); Kuan-Yu Liu, New Taipei City (TW)

(73) Assignee: SILVERSTONE TECHNOLOGY CO., LTD., New Taipei City (TW)

( * ) Notice: Subject to any disclaimer, the term of this patent is extended or adjusted under 35 U.S.C. 154(b) by 684 days.

(21) Appl. No.: 18/140,605

(22) Filed: Apr. 27, 2023

(65) Prior Publication Data

US 2024/0324138 A1 Sep. 26, 2024

(30) Foreign Application Priority Data

Mar. 22, 2023 (TW) ................................ 112202574

(51) Int. Cl.
*H05K 7/20* (2006.01)

(52) U.S. Cl.
CPC ..... *H05K 7/20218* (2013.01); *H05K 7/20172* (2013.01)

(58) Field of Classification Search
CPC ........ G06F 2200/201; G06F 2200/202; H05K 7/20163; H05K 7/20218; H05K 7/20172
USPC ....................... 165/80.4; 361/679.47, 679.48
See application file for complete search history.

(56) References Cited

U.S. PATENT DOCUMENTS

| | | | | |
|---|---|---|---|---|
| 5,579,827 A * | 12/1996 | Chung | H10W 40/43 257/722 |
| 6,186,889 B1 * | 2/2001 | Byrne | H05K 7/20172 361/695 |
| 6,343,012 B1 * | 1/2002 | Rife | H10W 40/43 165/185 |
| 7,278,467 B2 * | 10/2007 | Huang | F28D 15/00 165/104.31 |
| 7,447,027 B2 * | 11/2008 | Xia | H10W 40/43 257/E23.099 |
| 7,450,379 B2 * | 11/2008 | Chen | H05K 7/20172 312/236 |
| 7,864,526 B2 * | 1/2011 | Liu | H10W 40/43 165/104.33 |
| 7,959,419 B2 * | 6/2011 | Borowski | H05K 7/20172 417/423.15 |
| 9,926,935 B2 * | 3/2018 | Inda | F04D 29/601 |

(Continued)

*Primary Examiner* — Claire E Rojohn, III
(74) *Attorney, Agent, or Firm* — HDLS IPR SERVICES; Chun-Ming Shih

(57) ABSTRACT

A water-cooling heat dissipation device with adjustable fan direction includes a water block and fan module. The water block includes a main body, a water inlet joint communicating to the main body and a water outlet joint communicating to the main body. The main body has a first connector. The fan module is installed on the water block. The fan module includes a base and a fan. The base is connected to the main body and has a second connector electrically connected to the first connector and the fan. The fan is rotatably connected to the base and has a vane wheel formed outside the main body. In this way, the position of the fan may be adjusted to provide direct heat dissipation airflow according to the heat dissipation requirements of the electronic heat-generating components around a central processing unit.

9 Claims, 12 Drawing Sheets

(56) References Cited

U.S. PATENT DOCUMENTS

| | | | | | |
|---|---|---|---|---|---|
| 10,136,552 | B2 * | 11/2018 | Liu | G06F 1/20 | |
| 10,153,226 | B1 * | 12/2018 | Zou | F28D 15/0275 | |
| D848,962 | S * | 5/2019 | Fan | D13/179 | |
| 10,625,643 | B2 * | 4/2020 | Iacovone | B60N 2/70 | |
| 10,768,677 | B2 * | 9/2020 | Lin | F04D 13/0673 | |
| 11,073,338 | B2 * | 7/2021 | Lin | F01P 5/06 | |
| 11,197,391 | B2 * | 12/2021 | Chen | G06F 1/20 | |
| 11,252,837 | B2 * | 2/2022 | Nakae | F28D 1/05366 | |
| 11,624,559 | B2 * | 4/2023 | Huang | F28D 1/024 | 165/173 |
| 11,774,192 | B2 * | 10/2023 | Huang | F01P 3/18 | 165/104.31 |
| 11,963,330 | B2 * | 4/2024 | Huang | H05K 7/2039 | |
| 12,416,456 | B2 * | 9/2025 | Huang | F28D 1/05391 | |
| 2005/0036289 | A1 * | 2/2005 | Lee | H10W 40/43 | 361/699 |
| 2006/0237172 | A1 * | 10/2006 | Lo | F28D 1/024 | 361/698 |
| 2006/0274504 | A1 * | 12/2006 | Yao | H10W 40/43 | 257/E23.099 |
| 2014/0008039 | A1 * | 1/2014 | Liu | F28D 15/00 | 165/104.13 |
| 2017/0367217 | A1 * | 12/2017 | Xiao | F28D 1/05375 | |
| 2018/0017245 | A1 * | 1/2018 | Wang | F21V 29/677 | |
| 2018/0023594 | A1 * | 1/2018 | Sheng | F04D 1/06 | 165/104.31 |
| 2018/0063993 | A1 * | 3/2018 | Wu | H05K 7/20272 | |
| 2018/0092249 | A1 * | 3/2018 | Chiu | F28D 1/047 | |
| 2019/0104641 | A1 * | 4/2019 | Fan | G06F 1/20 | |
| 2019/0212077 | A1 * | 7/2019 | Lan | F28F 3/12 | |
| 2019/0380227 | A1 * | 12/2019 | Andre | F28F 3/08 | |
| 2020/0053911 | A1 * | 2/2020 | Han | G06F 1/20 | |
| 2020/0284264 | A1 * | 9/2020 | Deng | F04D 19/002 | |
| 2021/0294396 | A1 * | 9/2021 | Kostrzewski | H05K 7/20172 | |
| 2021/0386964 | A1 * | 12/2021 | Youngblood | A47C 21/003 | |
| 2023/0061299 | A1 * | 3/2023 | Sun | F04D 17/16 | |
| 2023/0168726 | A1 * | 6/2023 | Chen | F25B 21/02 | |
| 2024/0044343 | A1 * | 2/2024 | Andersen | F04D 29/601 | |
| 2024/0324138 | A1 * | 9/2024 | Chi | G06F 1/20 | |
| 2024/0324139 | A1 * | 9/2024 | Chi | H05K 7/20272 | |
| 2024/0401612 | A1 * | 12/2024 | Singh | F04D 29/664 | |
| 2025/0287550 | A1 * | 9/2025 | Eadelson | F28F 27/00 | |

* cited by examiner

WATER-COOLING HEAT DISSIPATION DEVICE WITH ADJUSTABLE FAN DIRECTION

BACKGROUND OF THE DISCLOSURE

Technical Field

The technical field relates to a water-cooling heat dissipation device, and more particularly relates to a water-cooling heat dissipation device with adjustable fan direction.

Description of Related Art

As the computing speed of electronic components such as central processing units (CPUs) in electronic products continues to increase, the heat generated by these components is also getting higher and higher. As a result, general air-cooling heat dissipation devices no longer meet the heat dissipation requirements at the current stage, and it is bound to use a water-cooling heat dissipation device with the function of circulating a working liquid such as water in order to efficiently dissipate the heat generated by the electronic components.

Although the related-art water-cooling heat dissipation device has already solved the aforementioned problem of the air-cooling heat dissipation device, the following problems still exist. Most fans used for the water-cooling heat dissipation device are installed above or inside the cooling object, and thus the fans can only dissipate heat for a single electronic heat-generating component, and heat is still accumulated or stacked at other electronic heat-generating components, and thus the heat dissipation of the overall system is limited. In addition, the installation positions of the mainboard and related electronic components produced by different manufacturers are not the same.

In view of the aforementioned problem, the discloser proposed this disclosure based on his expert knowledge and elaborated researches to overcome the problem of the related art and meet the needs of each manufacturer at the same time.

SUMMARY OF THE DISCLOSURE

It is a primary objective of this disclosure to provide a water-cooling heat dissipation device with adjustable fan direction, which may adjust the position of a fan to provide direct cooling airflow according to the heat dissipation requirements of the electronic components around the central processing unit.

To achieve the aforementioned objectives, this disclosure discloses a water-cooling heat dissipation device with adjustable fan direction, which includes a water block and a fan module, the water block includes a main body, a water inlet joint communicating to the main body and a water outlet joint communicating to the main body, the main body has a first connector; the fan module is installed on the water block and includes a base and a fan, the base is connected to the main body and has a second connector electrically connected to the first connector and the fan, and the fan is rotatably connected to the base and has a vane wheel formed outside the main body.

This disclosure has the following advantageous effects. The disclosure has taken into account the heat dissipation requirements of the central processing unit and other heat-generating components around the central processing unit. The position of the fan may be adjusted easily to provide a cooling airflow and avoid the fan from being collided or interfered by other related components around the fan. The disclosure also provides extended functions for lighting, data operation, temperature and other related parameters according to actual using requirements.

DETAILED DESCRIPTION

The technical contents of this disclosure will become apparent with the detailed description of embodiments accompanied with the illustration of related drawings as follows. It is intended that the embodiments and drawings disclosed herein are to be considered illustrative rather than restrictive.

With reference to FIGS. 1 to 5 for a water-cooling heat dissipation device with adjustable fan direction in accordance with this embodiment, the water-cooling heat dissipation device mainly includes a water block 10 and a fan module 20.

Figure 3:
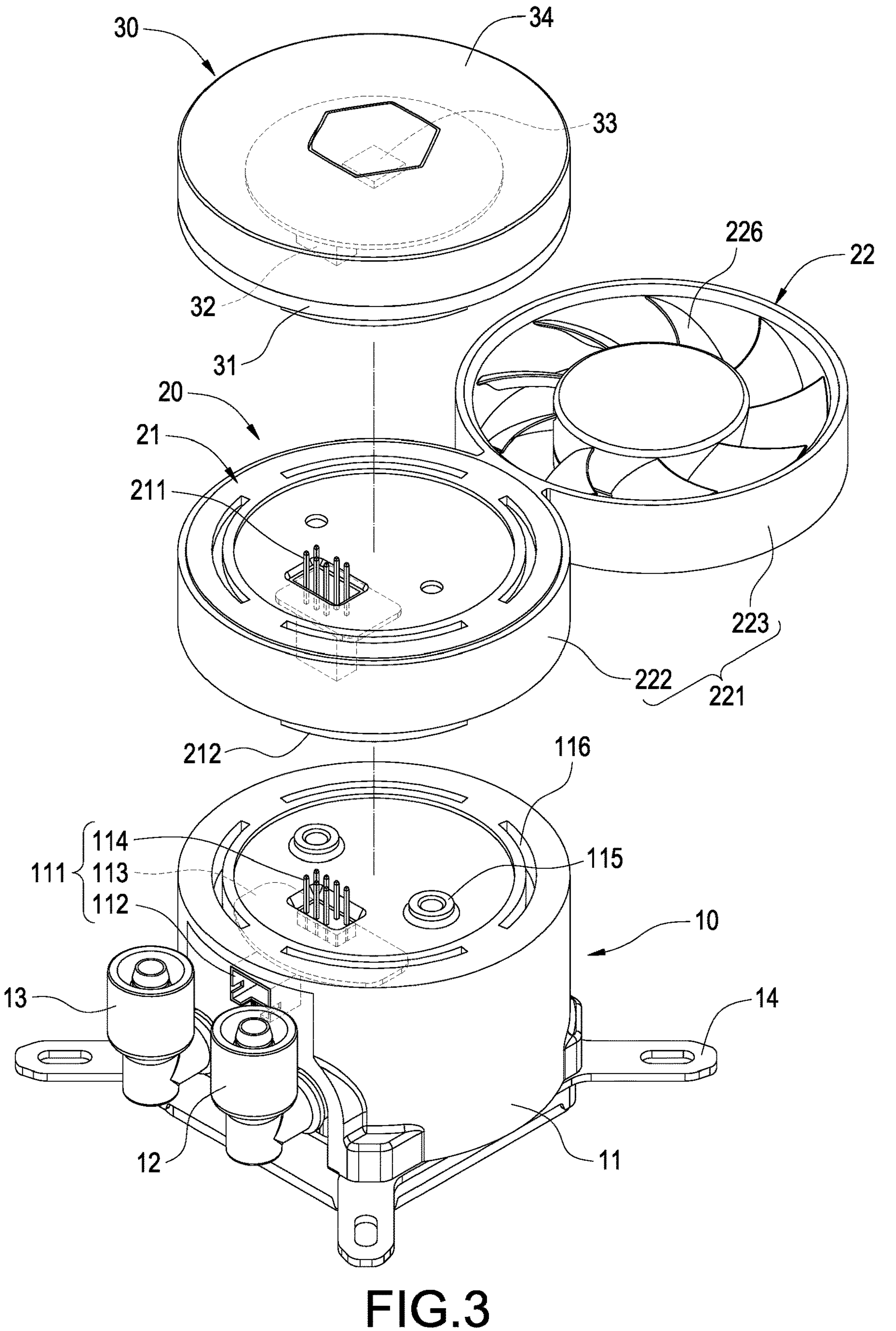
FIG. 3 is an exploded view of a water-cooling heat dissipation device of this disclosure.
Figure 4:
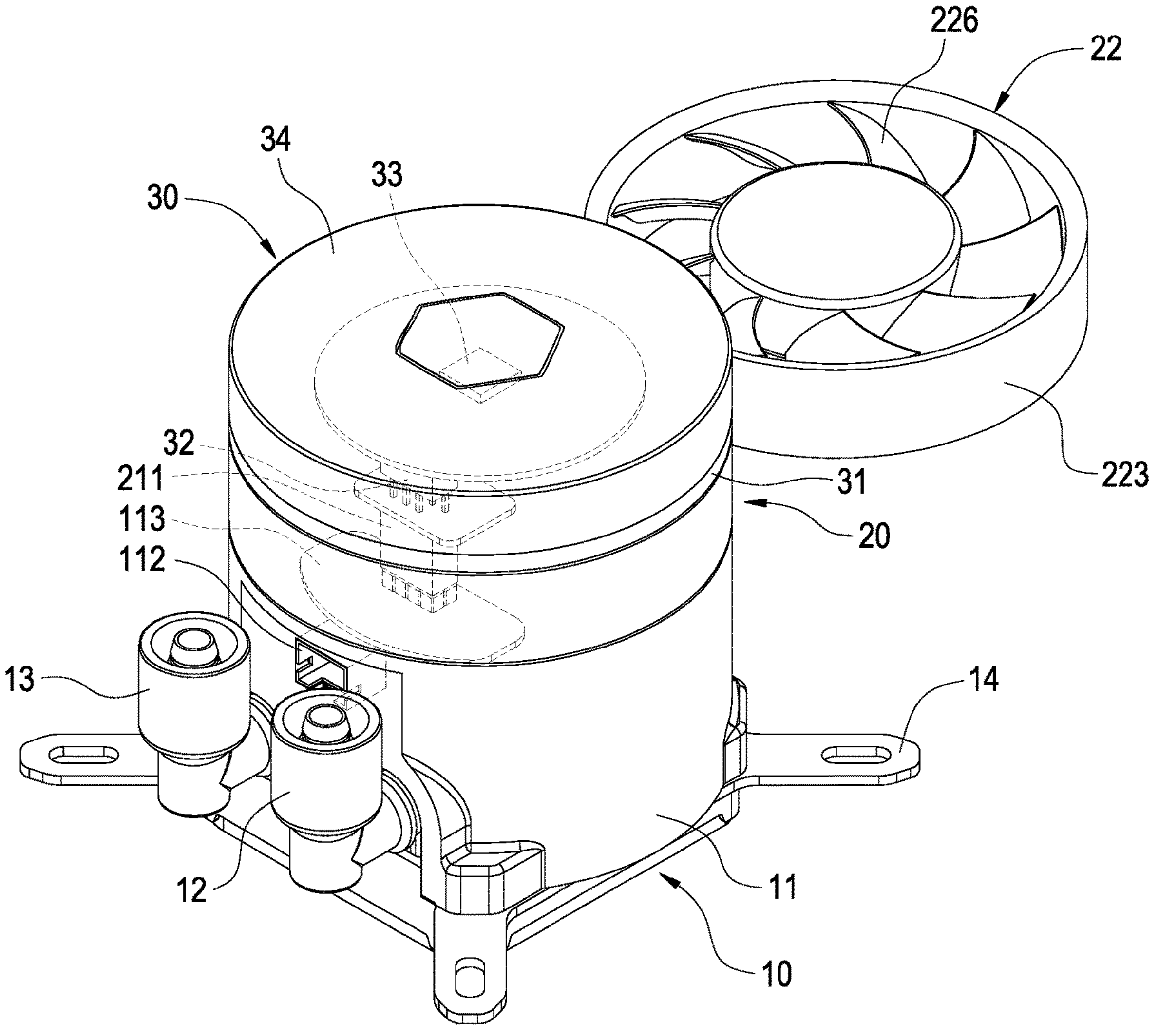
FIG. 4 is a perspective view of a water-cooling heat dissipation device of this disclosure.

In FIGS. 3 and 4, the water block 10 mainly includes a main body 11, a water inlet joint 12 and a water outlet joint 13, the main body 11 is mainly used for attaching to and cooling an electronic heat-generating component such as a central processing unit (CPU), a heat exchange chamber, a liquid channel, a water pump, and related components are formed inside the main body for flowing water in and out, the top of the main body 11 is provided with a first connector 111, the first connector 111 mainly includes a socket 112, a circuit board 113 and a plurality of conductive terminals 114. Each conductive terminal 114 is electrically connected to the socket 112 through a circuit on the circuit board 113, the socket 112 is disposed on a side edge of the main body 11, and each conductive terminal 114 is formed on the top surface of the main body 11. The main body 11 further includes a plurality of embedded grooves 116 and a plurality of positioning columns 115 disposed on the top surface of the main body 11, the embedded grooves 116 are disposed symmetrically and spacedly, and the positioning columns 115 are disposed on the center line of the main body 11 and spaced apart. The water inlet joint 12 is connected to the main body 11 and communicates with the interior of the main body 11, the water outlet joint 13 is connected to the main body 11 and communicates with the interior of the main body 11, and the water outlet joint 13 is formed at a side edge of the water inlet joint 12.

In an embodiment, the water block 10 includes a fixed frame 14 fixed to the bottom of the main body 11.

Figure 1:
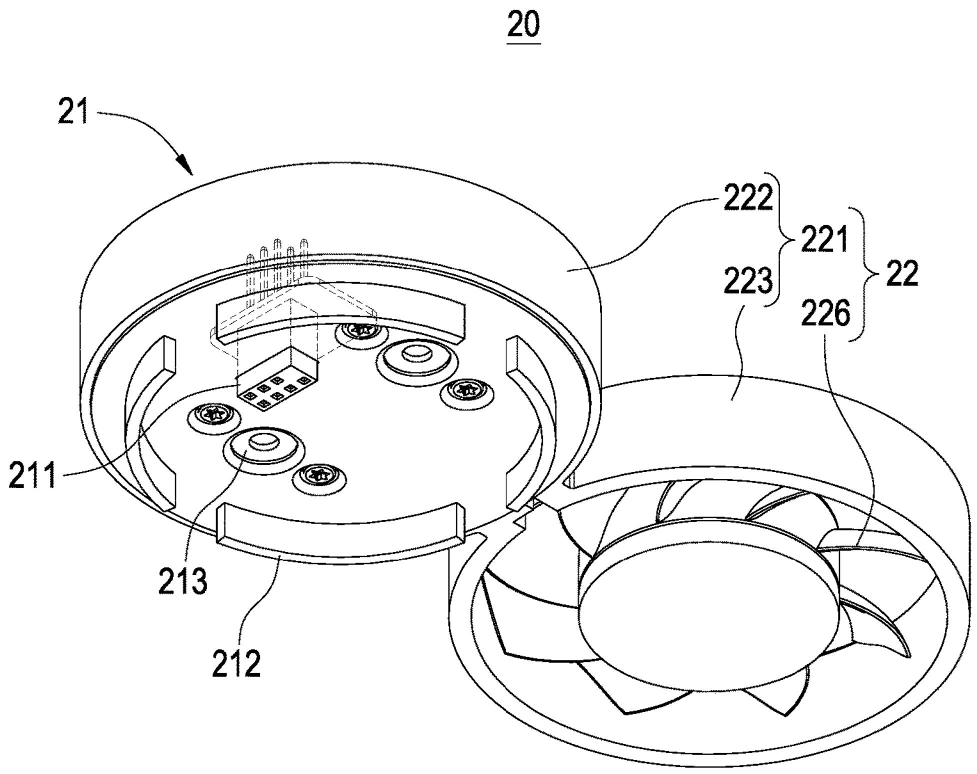
FIG. 1 is a perspective view of a fan module of this disclosure.
Figure 2:
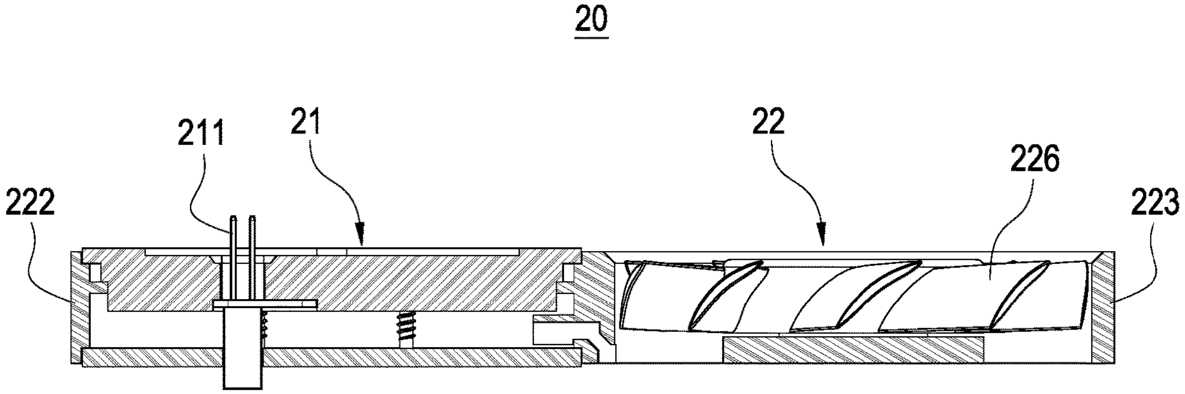
FIG. 2 is a cross-sectional view of a fan module of this disclosure.

In FIGS. 1 and 2, the fan module 20 is installed above the water block 10 and mainly includes a base 21 and a fan 22, the base 21 is substantially a round body connected to the main body 10, the base 21 includes a second connector 211, the second connector 211 has components such as a socket, a circuit board, a conductive terminal etc. The first connector 111 is plugged into and electrically connected to the corresponding second connector 211. The fan 22 is rotatably connected to the base 21 and mainly includes a frame 221 and a vane wheel (first vane wheel) 226, and the frame 221 mainly includes a first ring 222 and a second ring 223 connected to the first ring 222, the second ring 223 and the first ring 222 are installed side by side. The first ring 222 sheathes the base 21 and may rotate relative to the base 21, the vane wheel 226 is installed in the second ring 223 and electrically connected to the second connector 211 through a conductive wire (not shown in the figures). The vane wheel 226 of the fan 22 is disposed outside the main body 10.

In an embodiment, the base 21 includes a plurality of embedding plates 212 and a plurality of positioning grooves 213, each embedding plate 212 is plugged into each corresponding embedded groove 116, and each positioning groove 213 is provided for accommodating each corresponding positioning column 116.

In an embodiment of this disclosure as shown in FIGS. 3 and 4, the water-cooling heat dissipation device with adjustable fan direction further includes a light emitting module 30 installed on the fan module 20 and electrically connected to the fan module 20, the light emitting module 30 mainly includes a base plate 31, a third connector 32, a light emitting body 33 and a light-penetrable cover 34, the third connector 32 is fixed onto the base plate 31 and has components such as a socket, a circuit board and a conductive terminal, the third connector 32 is electrically connected to the second connector 211, the light emitting body 33 is installed onto the circuit board and electrically connected to the third connector 32, and the light-penetrable cover 34 covers the light emitting body 33 and is connected to the base plate 31.

Figure 5:
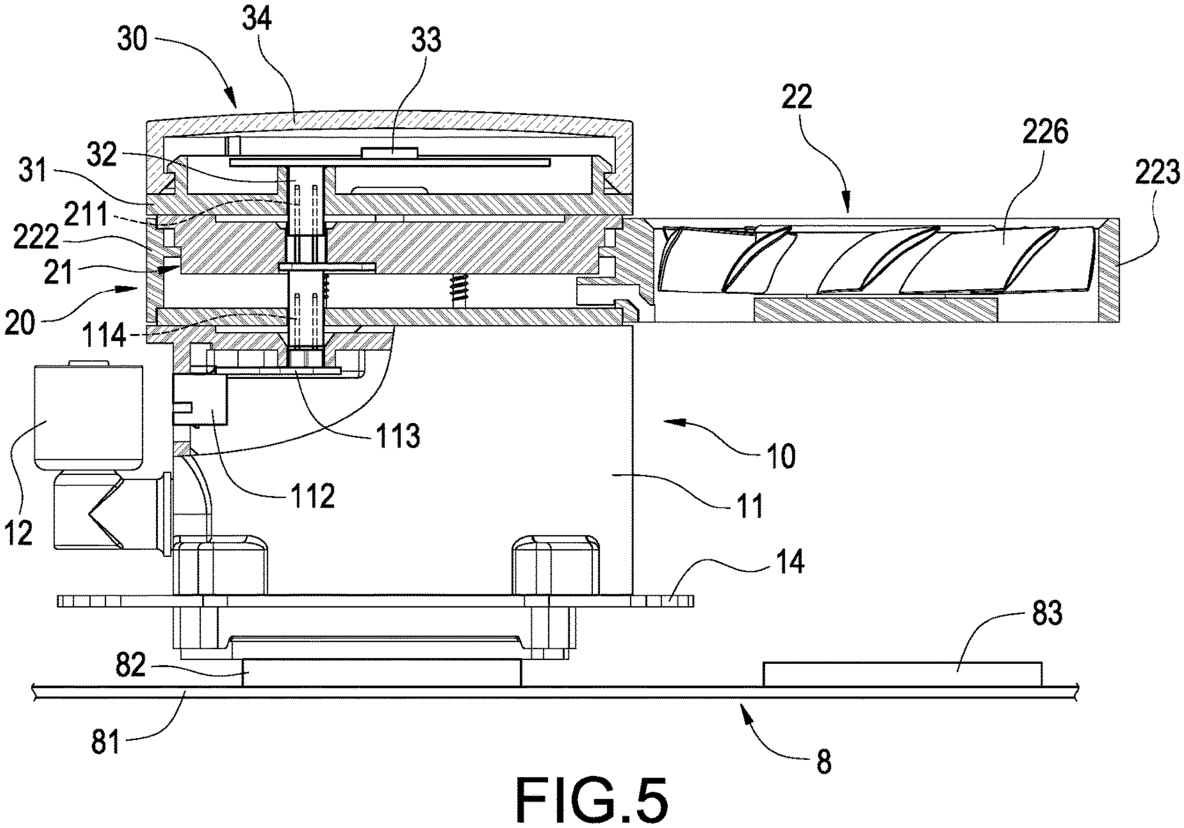
FIG. 5 is a cross-sectional view of a water-cooling heat dissipation device applied to a mainboard in accordance with this disclosure.

In FIG. 5, during use, the water-cooling heat dissipation device of this disclosure is installed onto a mainboard 8, the mainboard 8 has a circuit board 81, a central processing unit 82 and other electronic heat-generating components 83 (such as southbridge chip, northbridge chip, display card module, transformer, electrical connector, etc.) installed on the circuit board 81, each electronic heat-generating component 83 is formed in an area around the central processing unit 82. The main body 11 of the water block 10 is attached onto the top surface of the central processing unit 82, and connected to the circuit board 81 and the fixed frame 14 by screws or other locking elements for fixation. When the electronic heat-generating component 83 needs to be cooled, the direction of the frame 221 is turned to set the vane wheel 226 to a position above each electronic heat-generating component 83, so as to provide direct cooling airflow.

Figure 6:
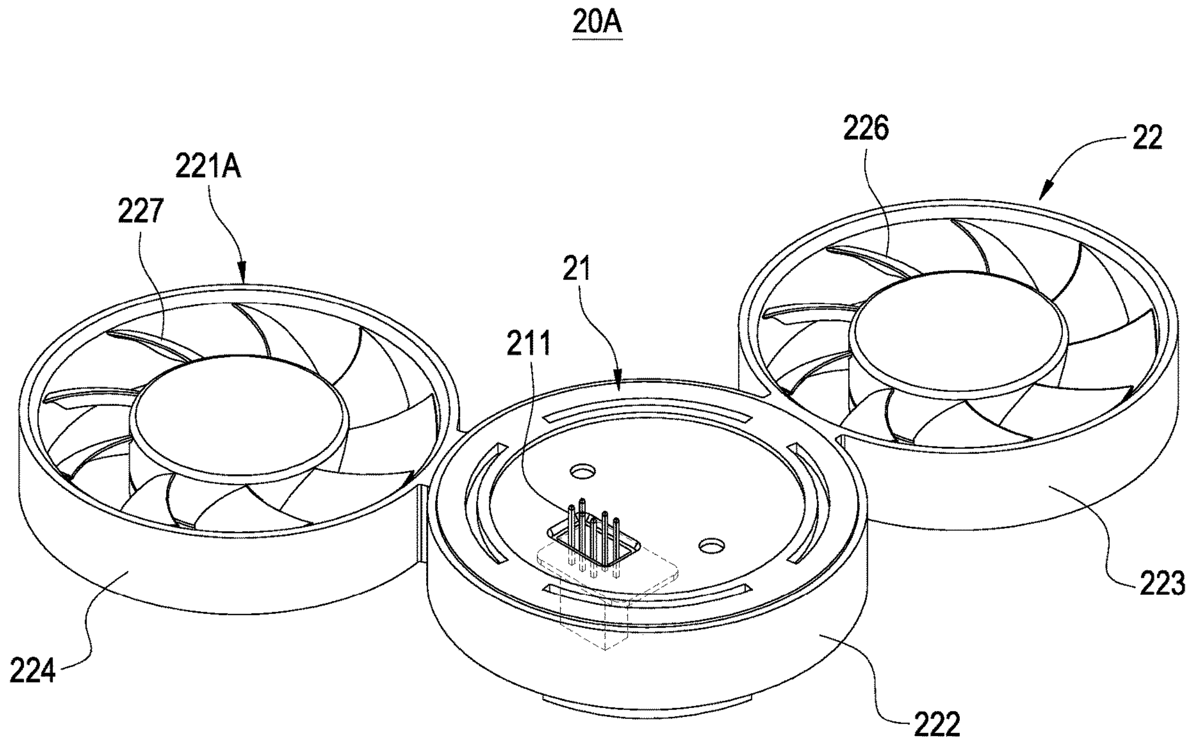
FIG. 6 is a perspective view of a fan module of another embodiment of this disclosure.

In FIG. 6, the frame 221A of the fan module 20A of this embodiment includes a third ring 224 and another vane wheel (second vane wheel) 227, the third ring 224 is extended from the first ring 222 and spaced apart from the second ring 223, the other vane wheel 227 is installed in the third ring 224 and electrically connected to the second connector 211 through a conductive wire. When each electronic heat-generating component 83 around the central processing unit 82 needs to be cooled, the direction of the frame 221 is turned to set the vane wheel 226 and the other vane wheel 227 to the positions above each electronic heat-generating component 83 respectively, so as to provide direct cooling airflow.

Figure 7:
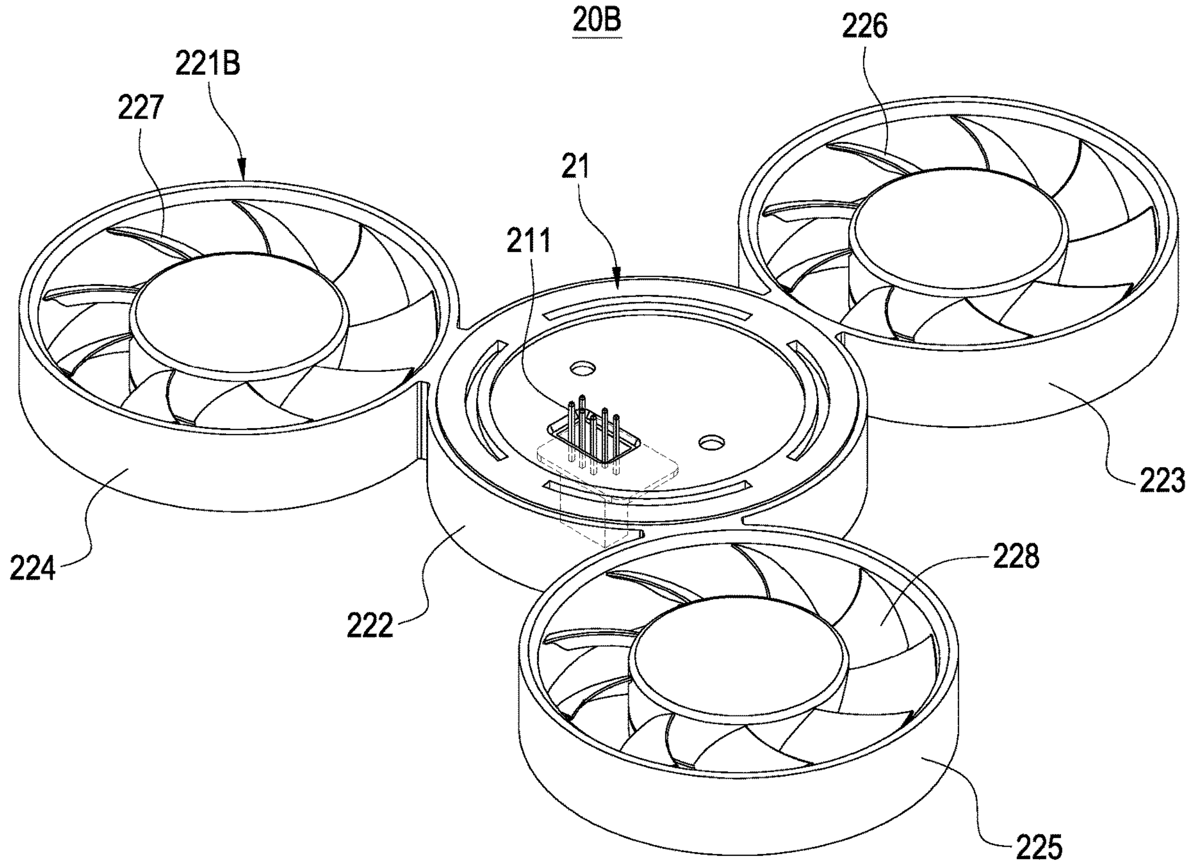
FIG. 7 is a perspective view of a fan module of a further embodiment of this disclosure.

In FIG. 7, the fan module 20B of this embodiment has the aforementioned structure of the fan module 20A, and the frame 221B further includes a fourth ring 225 and a further vane wheel (third vane wheel) 228, the fourth ring 225 is extended from the first ring 222 and spaced apart from the second ring 223 and the third ring 224, the further vane wheel 228 is installed in the fourth ring 225 and electrically connected to the second connector 211 through a conductive wire. When each electronic heat-generating component 83 around the central processing unit 82 needs to be cooled, the direction of the frame 221 is turned to set the vane wheel 226, the other vane wheel 227, and the further vane wheel 228 to the positions above each electronic heat-generating component 83 respectively, so as to provide direct cooling airflow.

Figure 8:
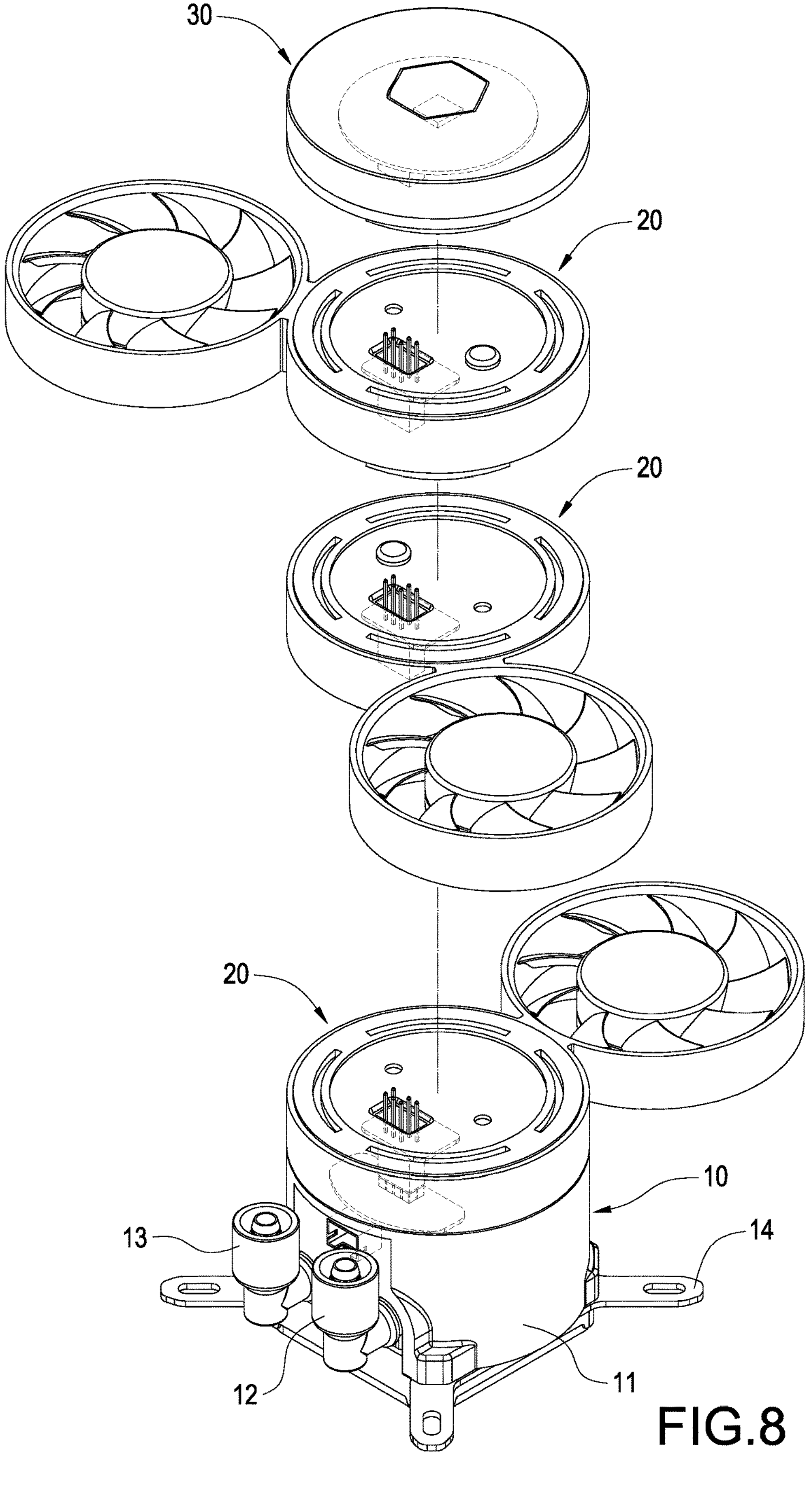
FIG. 8 is an exploded view of a water-cooling heat dissipation device in accordance with another embodiment of this disclosure.
Figure 9:
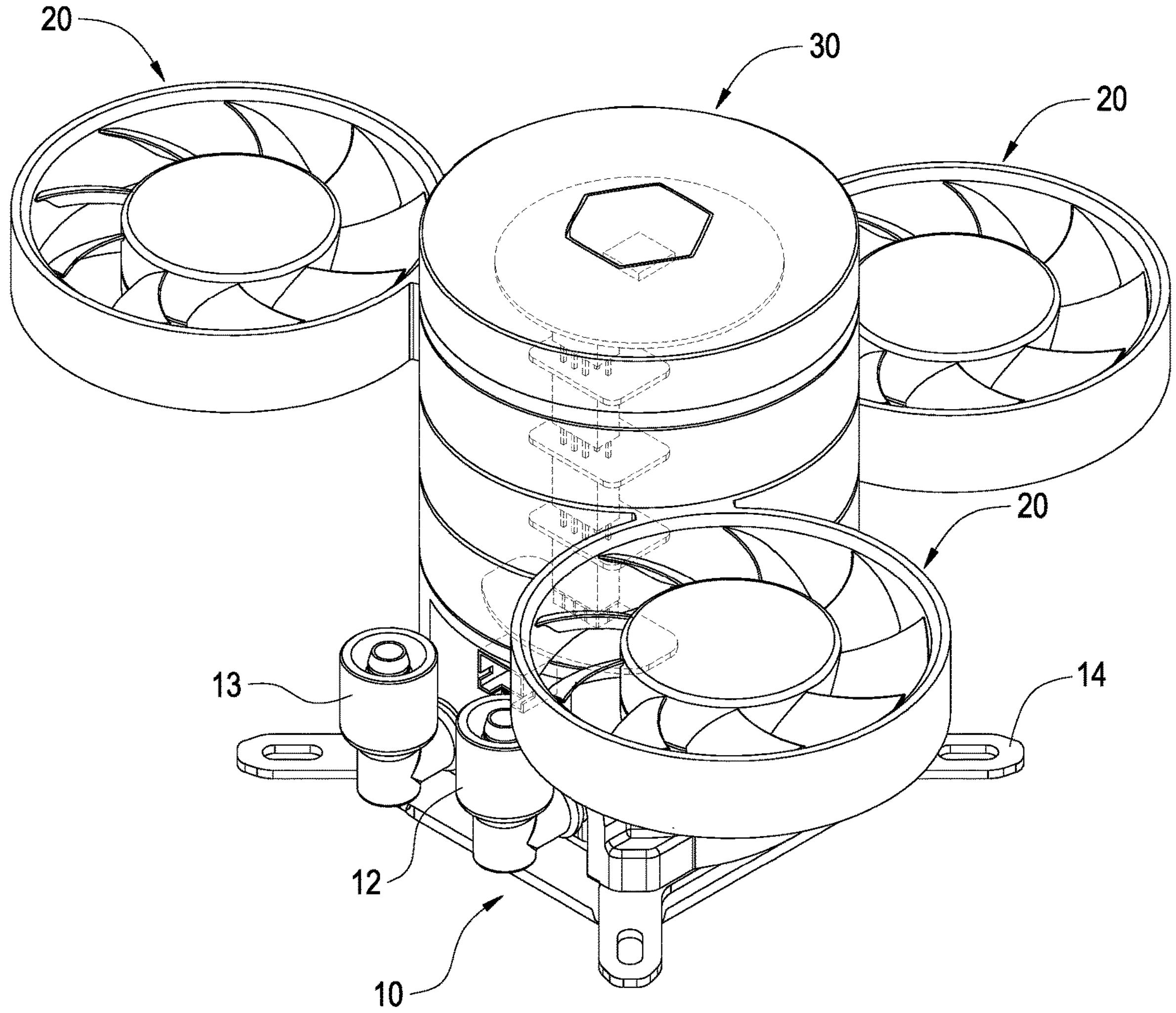
FIG. 9 is a perspective view of a water-cooling heat dissipation device in accordance with another embodiment of this disclosure.

In an embodiment as shown in FIGS. 8 and 9, the plurality of fan modules 20 is stacked on one another. When each electronic heat-generating component 83 around the central processing unit 82 needs to be cooled, the direction of the frame 221 is turned to set each vane wheel 226 to a position above each electronic heat-generating component 83, so as to provide direct cooling airflow.

Figure 10:
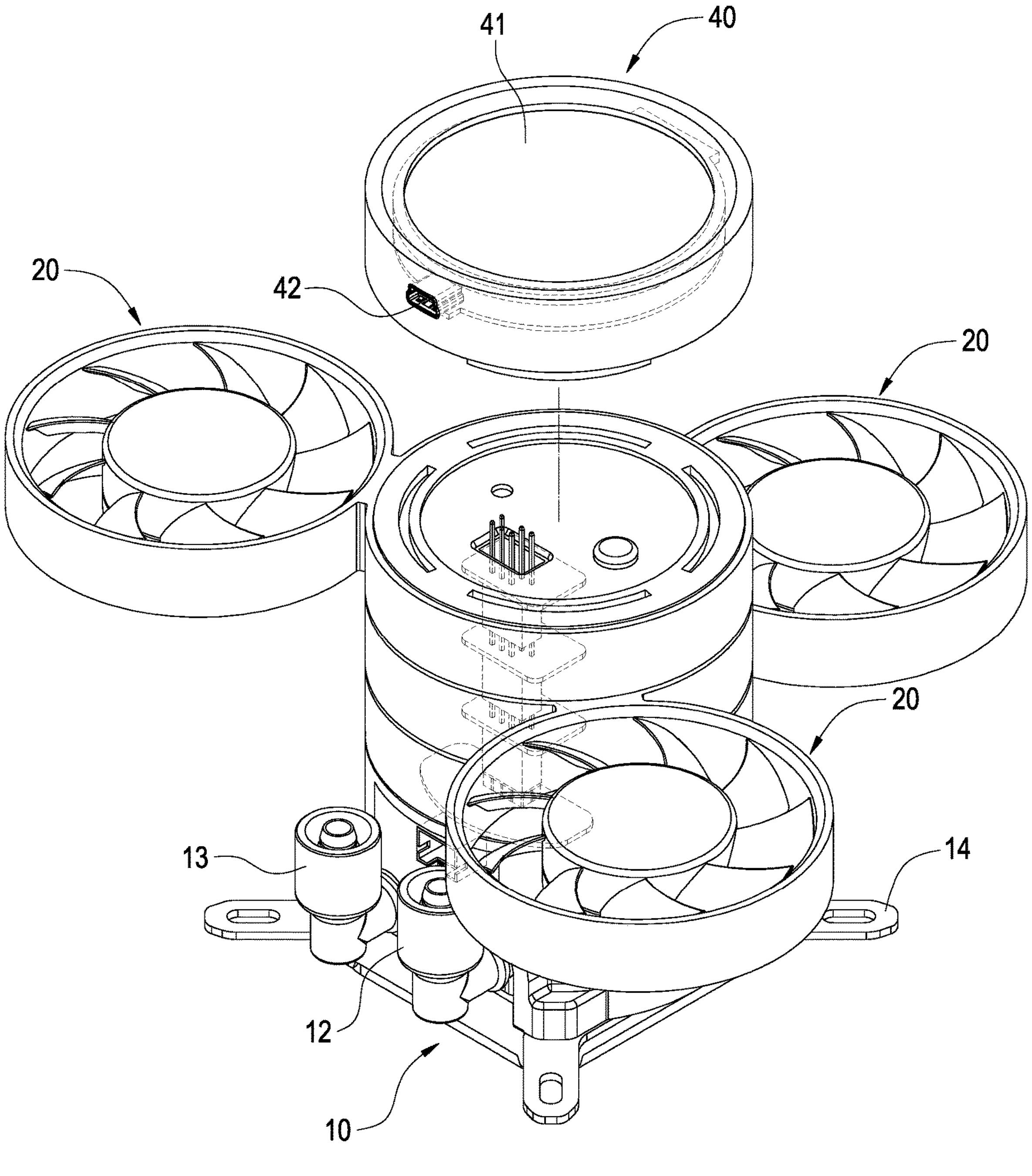
FIG. 10 is a partially exploded view of a water-cooling heat dissipation device in accordance with a further embodiment of this disclosure a further.
Figure 11:
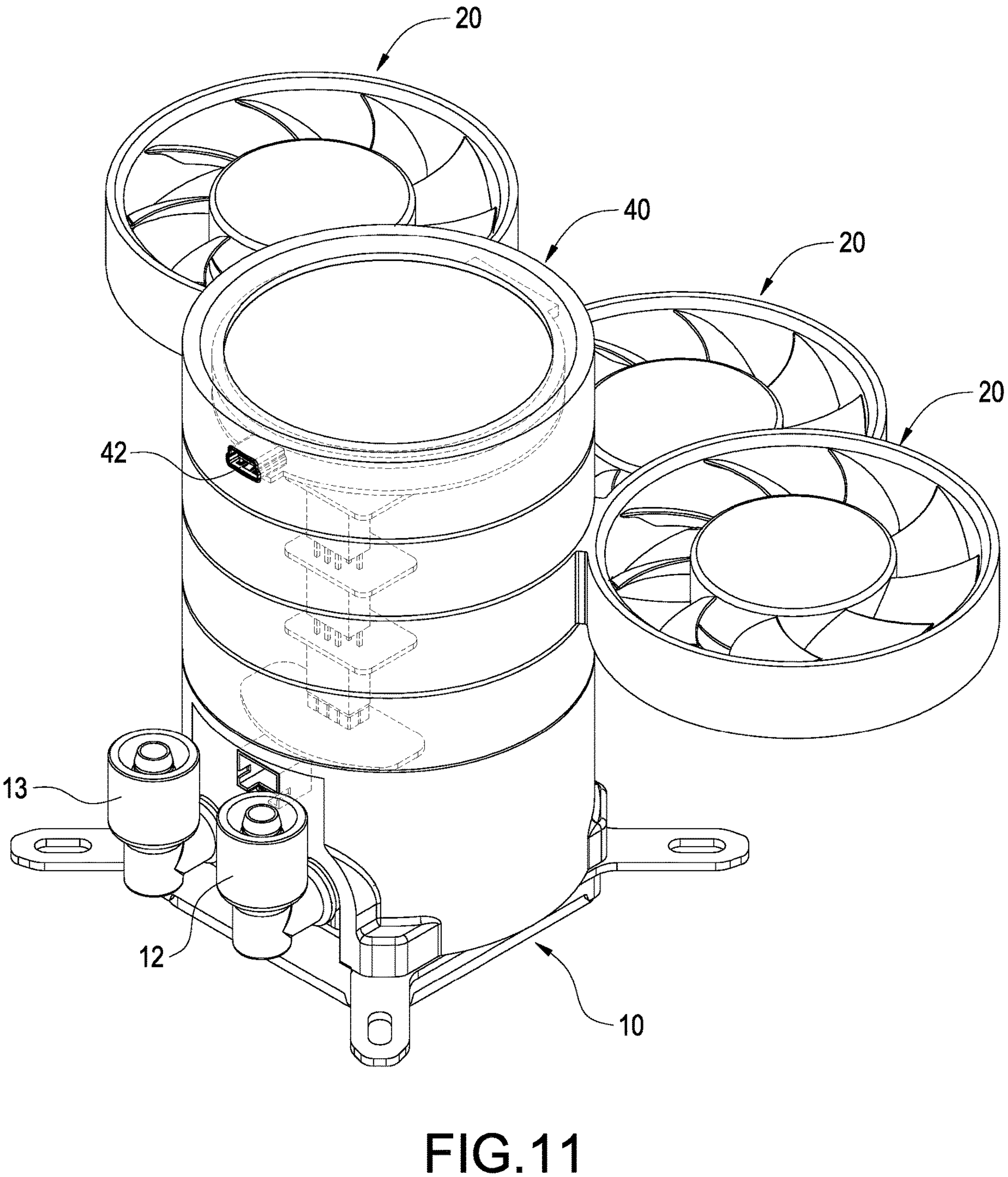
FIG. 11 is a perspective view of a water-cooling heat dissipation device in accordance with a further embodiment of this disclosure.

In an embodiment as shown in FIGS. 10 and 11, the water-cooling heat dissipation device with adjustable fan direction of this disclosure further includes a display module 40 installed on the fan module 20, the display module 40 mainly includes a display screen 41 and a port 42 electrically connected to the display screen 41, the port 42 is provided for plugging and connecting a cable (not shown in the figures), and the display screen 41 provides related parameters such as rotating speed, temperature, etc. of each component.

Figure 12:
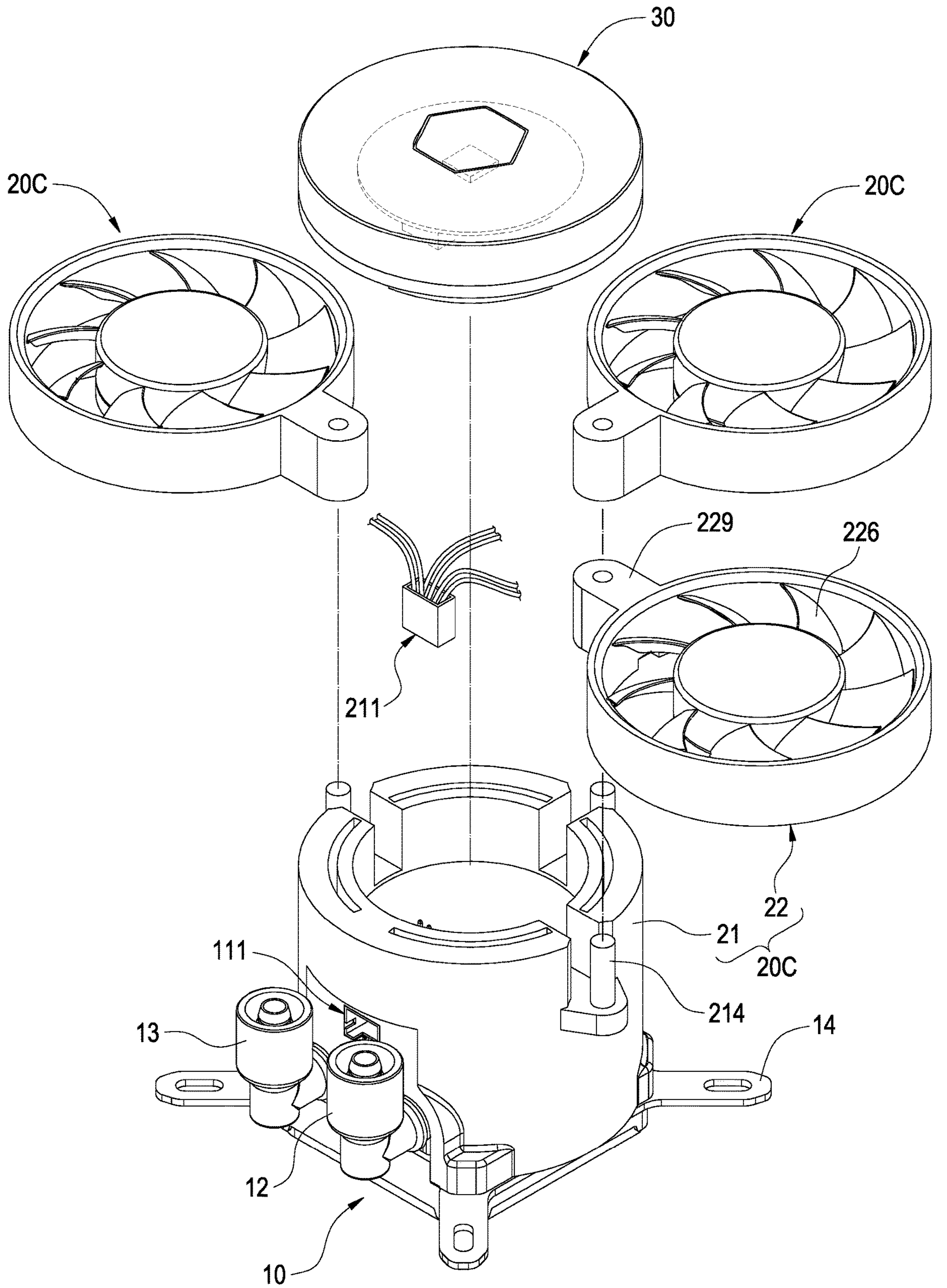
FIG. 12 is an exploded view of a water-cooling heat dissipation device in accordance with another embodiment of this disclosure.
Figure 13:
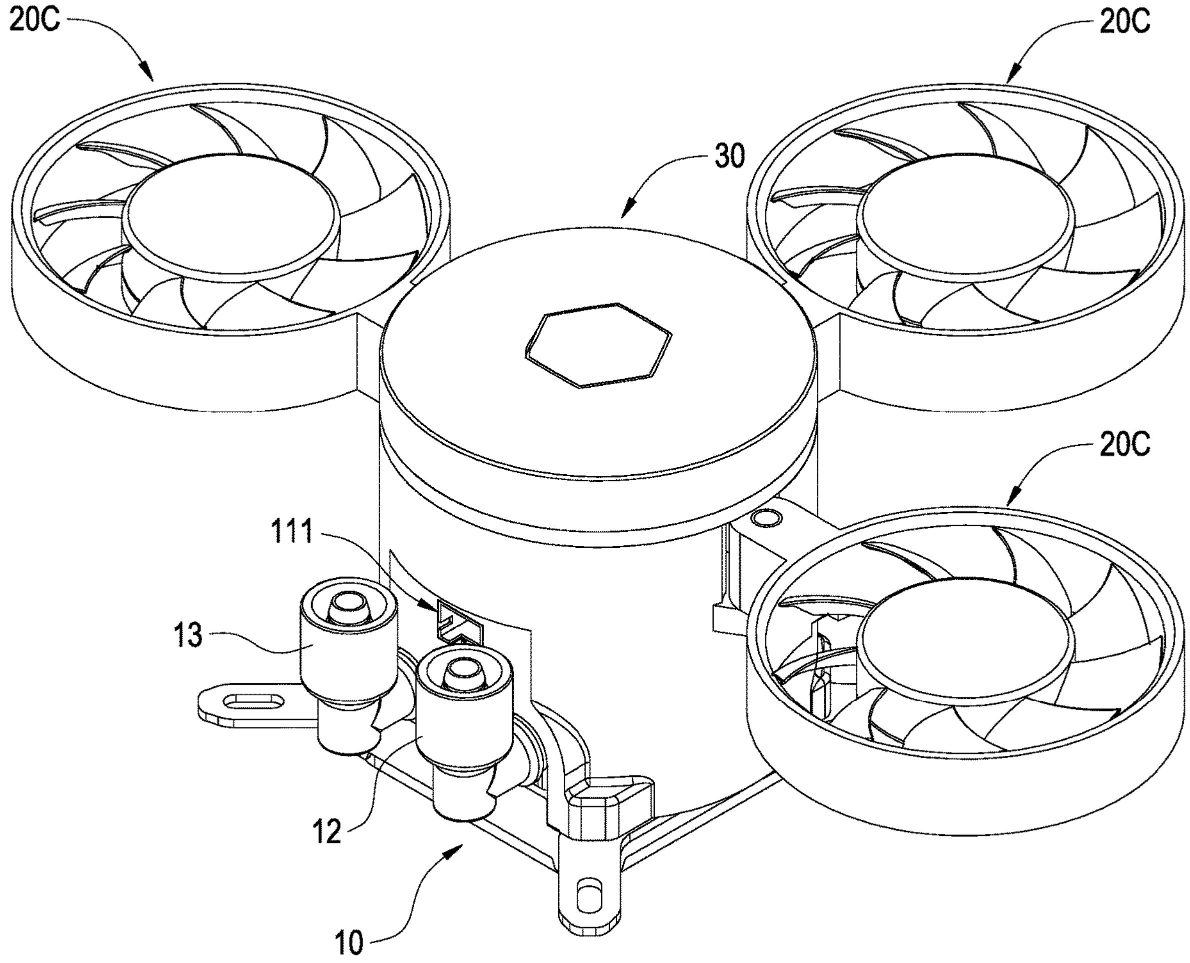
FIG. 13 is a perspective view of a water-cooling heat dissipation device in accordance with another embodiment of this embodiment.

In an embodiment as shown in FIGS. 12 and 13, the base 21 of the fan module 20C and the main body of the water block 10 are integrally formed (or formed in one piece), a plurality of pivots 214 is formed on and spaced apart from the base 21, each fan 22 mainly includes a vane wheel 226 and a pivot ring seat 229, the vane wheel 226 is installed in the pivot ring seat 229, each vane wheel 2261 is electrically connected to the second connector 21 through a conductive wire, and each pivot ring seat 229 is rotatably connected to each pivot 214. These arrangements also provide the same effect as the above-mentioned embodiments.

While this disclosure has been described by means of specific embodiments, numerous modifications and variations could be made thereto by those skilled in the art without departing from the scope and spirit of this disclosure set forth in the claims.

What is claimed is:

1. A water-cooling heat dissipation device, comprising:

a water block, comprising a main body, a water inlet joint communicating with the main body, a water outlet joint communicating with the main body, and a first connector disposed on the main body; and a fan module, installed on the water block, comprising a base and a fan, the base connected to the main body and comprising a second connector electrically coupled to the first connector and the fan, and the fan rotatable with respect to the base stacked on the main body and comprising a first vane wheel located outside the main body;

wherein the fan further comprises a frame, the frame comprises a first ring and a second ring coupled to the first ring, the second ring and the first ring are arranged side by side with each other, the first ring is adapted to rotatably sheathe the base so the fan is rotatable with respect to the base, and the first vane wheel is installed in the second ring.

2. The water-cooling heat dissipation device according to claim 1, wherein the frame further comprises a third ring and a second vane wheel, the third ring is extended from the first ring and disposed spacedly from the second ring, and the second vane wheel is installed in the third ring and electrically coupled to the second connector.

3. The water-cooling heat dissipation device according to claim 2, wherein the frame further comprises a fourth ring and a third vane wheel, the fourth ring is extended from the first ring and disposed spacedly from the second ring and the third ring, and the third vane wheel is installed in the fourth ring and electrically coupled to the second connector.

4. A water-cooling heat dissipation device, comprising:

a water block, comprising a main body, a water inlet joint communicating with the main body, a water outlet joint communicating with the main body, and a first connector disposed on the main body; and a fan module, installed on the water block, comprising a base and a fan, the base connected to the main body and comprising a second connector electrically coupled to the first connector and the fan, and the fan rotatably coupled to the base and comprising a first vane wheel located outside the main body;

wherein the base comprises a plurality of embedding plates and a plurality of positioning grooves, the main body comprises a plurality of embedded grooves and a plurality of positioning columns, each of the embedding plates is plugged in each of the embedded grooves correspondingly, and each of the positioning columns is accommodated in each of the positioning grooves correspondingly.

5. The water-cooling heat dissipation device according to claim 1, further comprising a light emitting module installed on the fan module and electrically coupled to the fan module.

6. The water-cooling heat dissipation device according to claim 5, wherein the light emitting module comprises a base plate, a third connector, a light emitting body and a light-penetrable cover, the third connector is fixed on the base plate and electrically coupled to the second connector, the light emitting body and the third connector are electrically coupled to each other, and the light-penetrable cover covers the light emitting body and is coupled to the base plate.

7. The water-cooling heat dissipation device according to claim 1, further comprising a display module installed on the fan module, and the display module comprising a display screen and a port electrically coupled to the display screen.

8. The water-cooling heat dissipation device according to claim 1, wherein the base and the main body are integrally formed, the base comprises a plurality of pivots, the fan is multiple in number, each fan further comprises a pivot ring seat, the first vane wheel is installed in the pivot ring seat, and each of the pivot ring seats is rotatably coupled to each of the pivots.

9. A water-cooling heat dissipation device, comprising:

a water block, comprising a main body, a water inlet joint communicating with the main body, a water outlet joint communicating with the main body, and a first connector disposed on the main body; and a fan module, installed on the water block, comprising a base and a fan, the base connected to the main body and comprising a second connector electrically coupled to the first connector and the fan, and the fan rotatably coupled to the base and comprising a first vane wheel located outside the main body;

wherein the first connector comprises a socket, a circuit board and a plurality of conductive terminals, each of the conductive terminals is electrically coupled to the socket through the circuit board, the socket is disposed on a side edge of the main body, and each of the conductive terminals is disposed on a top of the main body.

* * * * *